(12) United States Patent
Dupont et al.

(10) Patent No.: US 10,418,506 B2
(45) Date of Patent: Sep. 17, 2019

(54) LIGHT-EMITTING DEVICE WITH INTEGRATED LIGHT SENSOR

(71) Applicant: Aledia, Grenoble (FR)

(72) Inventors: Tiphaine Dupont, Grenoble (FR); Erwan Dornel, Fontaine (FR)

(73) Assignee: Aledia, Grenoble (FR)

( * ) Notice: Subject to any disclaimer, the term of this patent is extended or adjusted under 35 U.S.C. 154(b) by 0 days.

(21) Appl. No.: 15/758,721

(22) PCT Filed: Sep. 9, 2016

(86) PCT No.: PCT/FR2016/052275
§ 371 (c)(1),
(2) Date: Mar. 8, 2018

(87) PCT Pub. No.: WO2017/042512
PCT Pub. Date: Mar. 16, 2017

(65) Prior Publication Data
US 2018/0261584 A1    Sep. 13, 2018

(30) Foreign Application Priority Data
Sep. 10, 2015   (FR) ..................................... 15 58408

(51) Int. Cl.
*H01L 31/173* (2006.01)
*H01L 31/16* (2006.01)
(Continued)

(52) U.S. Cl.
CPC .......... *H01L 31/173* (2013.01); *H01L 25/167* (2013.01); *H01L 27/14643* (2013.01);
(Continued)

(58) Field of Classification Search
CPC ..... H01L 31/16; H01L 31/165; H01L 31/167; H01L 31/173
See application file for complete search history.

(56) References Cited

U.S. PATENT DOCUMENTS

| 5,629,534 A | * | 5/1997 | Inuzuka | ................ H01L 31/173 |
| | | | | 257/524 |
| 2011/0079796 A1 | * | 4/2011 | Wober | .................... H01L 27/15 |
| | | | | 257/82 |

(Continued)

FOREIGN PATENT DOCUMENTS

| FR | 3 011 381 A1 | 4/2015 |
| JP | 2 879971 B2 | 4/1999 |
| JP | 2006 278368 A | 10/2006 |

OTHER PUBLICATIONS

English Translation of Foreign reference JP2006-278368 to Toyomi et al. dated Oct. 12, 2006.*

(Continued)

*Primary Examiner* — Grant S Withers
(74) *Attorney, Agent, or Firm* — Wolf, Greenfield & Sacks, P.C.

(57) ABSTRACT

A light-emitting device including a substrate at least partially doped with a first type of conductivity and including a face; light-emitting diodes each including at least one three-dimensional semiconducting element which is undoped or doped with the first type of conductivity and resting on the said face; and semiconducting regions forming photodiodes, at least partially doped with a second type of conductivity opposite to the first type of conductivity and extending in the substrate from the said face between at least some of the three-dimensional semiconducting elements, a portion of the substrate of first type of conductivity extending up to the said face at the level of each three-dimensional semiconducting element.

12 Claims, 3 Drawing Sheets

(51) Int. Cl.
   *H01L 31/167* (2006.01)
   *H01L 25/16* (2006.01)
   *H01L 33/08* (2010.01)
   *H01L 33/18* (2010.01)
   *H01L 27/146* (2006.01)
   *H01L 27/15* (2006.01)

(52) U.S. Cl.
   CPC ............ *H01L 31/16* (2013.01); *H01L 31/165* (2013.01); *H01L 31/167* (2013.01); *H01L 33/08* (2013.01); *H01L 33/18* (2013.01); *H01L 27/156* (2013.01)

(56) References Cited

U.S. PATENT DOCUMENTS

2016/0172528 A1\* 6/2016 Okushiba .............. H01L 31/173
                                                    257/81
2016/0197064 A1\* 7/2016 Bouvier ................. H01L 33/08
                                                    257/13

OTHER PUBLICATIONS

English Translation of Foreign reference JP2879971 (with corresponding application No. JP040207079) to Yoshiaki et al. dataed Apr. 5, 1999).\*
International Search Report for Application No. PCT/FR2016/052275 dated Nov. 30, 2016.
Written Opinion for Application No. PCT/FR2016/052275 dated Nov. 30, 2016.

\* cited by examiner

LIGHT-EMITTING DEVICE WITH INTEGRATED LIGHT SENSOR

CROSS-REFERENCE TO RELATED APPLICATIONS

This application is the national phase of International Application No. PCT/FR2016/052275, filed on Sep. 9, 2016, which claims priority to French Patent Application No. 15/58408, filed on Sep. 10, 2015, both of which applications are incorporated herein by reference to the maximum extent allowable.

BACKGROUND

The present invention generally relates to light-emitting devices based on semiconductor materials and to methods of manufacturing the same. Light-emitting devices means devices capable of converting an electric signal into an electromagnetic radiation.

DISCUSSION OF THE RELATED ART

For certain applications, it is desirable to measure the radiation emitted by a light-emitting device. This is particularly true to perform tests during the manufacturing of the light-emitting device or when the light-emitting device is operating. The measurement of the radiation emitted by a light-emitting device may be performed by means of a light sensor, comprising at least one photodiode, different from the light-emitting device, which causes an additional cost. Further, to perform a continuous measurement of light, the light sensor should generally be placed in the emission field of the light-emitting device and, thereby, block part of the light flow which would be perceived by an observer, which is not desirable.

It would be desirable to be able to form the light sensor so that it is integrated to the light-emitting device. This would enable to easily measure the radiation emitted by the light-emitting device at given times, and particularly continuously. The light sensor could further be placed so as to directly measure the radiation emitted by the active layers of the light-emitting device before it is modified by other elements of the light-emitting device.

Patent application WO2014/154657 describes an optoelectronic device comprising an integrated light sensor. The optoelectronic device comprises light-emitting diodes having the shape of semiconductor nanowires. Some of the wires, normally used to form light-emitting diodes, are modified to form the light sensor.

A disadvantage of the optoelectronic device described in patent application WO2014/154657 is that the efficiency of the light sensor may be low. Further, the wires used for the light sensor no longer take part in the light emission of the optoelectronic device. The maximum light power that can be emitted by such an optoelectronic device is thus smaller than that of an optoelectronic device of same dimensions where all the semiconductor wires are dedicated to light emission.

SUMMARY

Thus, an object of an embodiment is to overcome at least part of the disadvantages of the previously-described light-emitting devices comprising an integrated light sensor and of their manufacturing methods.

Another object of an embodiment is for the integration of the light sensor to the light-emitting device to cause no decrease in the light power emitted by the light-emitting device.

Another object of an embodiment is to improve the efficiency of the light sensor.

Thus, an embodiment provides a light-emitting device comprising:

an at least partially doped substrate of a first conductivity type, comprising a surface;

light-emitting diodes each comprising at least one non-doped or doped three-dimensional semiconductor element of the first conductivity type, resting on said surface; and semiconductor regions forming at least partially doped photodiodes of a second conductivity type opposite to the first conductivity type, extending in the substrate from said surface between at least some of the three-dimensional semiconductor elements, a portion of the substrate of the first conductivity type extending all the way to said surface at the level of each three-dimensional semiconductor element.

According to an embodiment, each three-dimensional semiconductor element is mainly made of a compound selected from the group comprising III-V compounds and II-VI compounds.

According to an embodiment, the substrate is at least partly made of a semiconductor material selected from the group comprising silicon, germanium, silicon carbide, or GaAs.

According to an embodiment, the device further comprises conductive tracks on said surface in contact with the semiconductor regions.

According to an embodiment, the device further comprises, an at least partially reflective layer covering the semiconductor regions, an insulating layer being interposed between the semiconductor regions and said at least partially reflective layer.

According to an embodiment, the semiconductor elements are nanowires, microwires, and/or nanometer- or micrometer-range pyramidal structures.

According to an embodiment, the device further comprises electrically-insulating regions extending along the lateral edges of at least certain semiconductor regions.

According to an embodiment, the device further comprises an electrically-insulating layer located in depth in the substrate and comprises, for each semiconductor region, a region of the first conductivity type interposed between the insulating layer and the semiconductor region.

According to an embodiment, the semiconductor regions have the shape of strips, electrically connected or not.

According to an embodiment, the semiconductor regions have the shape of a hexagonal tiling.

According to an embodiment, the semiconductor regions form a continuous region crossed by said portions.

According to an embodiment, the semiconductor regions are formed by ion implantation of dopants.

According to an embodiment, the semiconductor regions are formed by epitaxy.

According to an embodiment, the light-emitting diodes are distributed into at least first and second assemblies of separately controlled light-emitting diodes.

According to an embodiment, the semiconductor regions are distributed into at least first and second assemblies of semiconductor regions, the semiconductor regions of the first assembly of semiconductor regions extending in the substrate from said surface between at least some of the three-dimensional semiconductor elements of the first assembly of light-emitting diodes and the semiconductor regions of the second assembly of semiconductor regions extending in the substrate from said surface between at least some of the three-dimensional semiconductor elements of the second assembly of light-emitting diodes, the semiconductor regions of the first assembly of semiconductor regions being electrically insulated from the semiconductor regions of the second assembly of semiconductor regions.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
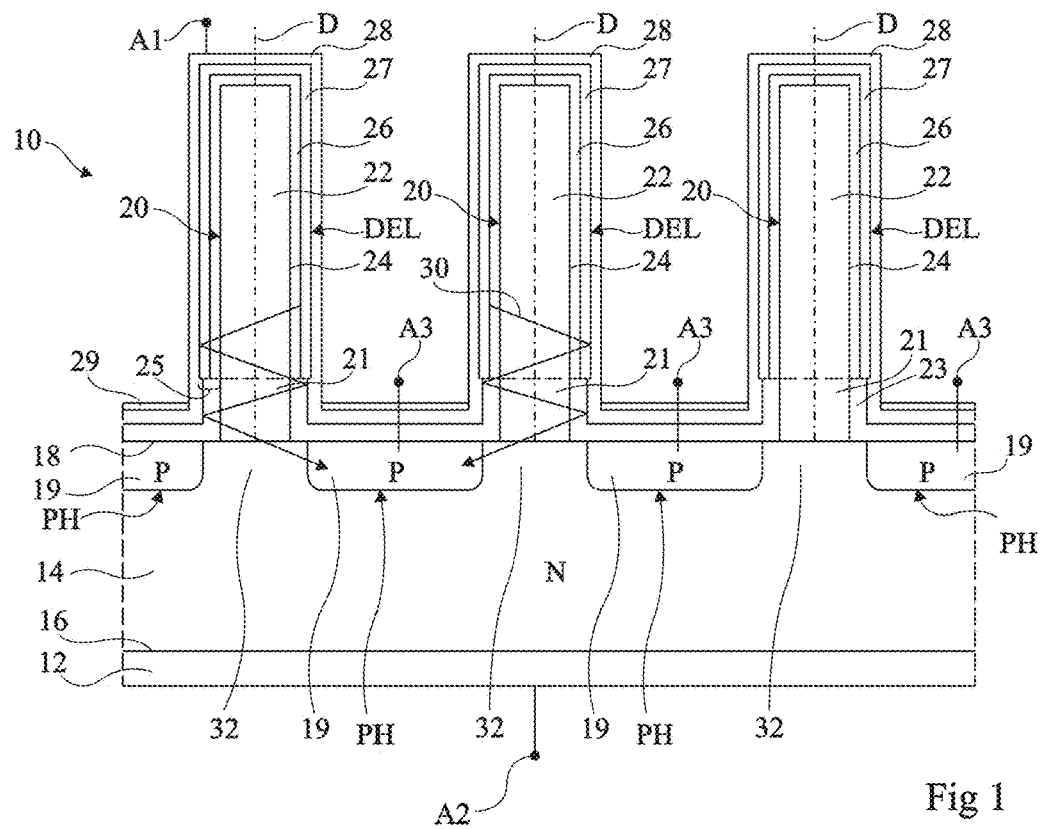
FIGS. 1 to 3 are partial simplified cross-section views of embodiments of light-emitting devices comprising microwires or nanowires.

For clarity, the same elements have been designated with the same reference numerals in the various drawings and, further, as usual in the representation of electronic circuits, the various drawings are not to scale. Further, only those elements which are useful to the understanding of the present description have been shown and are described. In particular, the means for controlling the light-emitting devices described hereafter are within the abilities of those skilled in the art and are not described. In the following description, unless otherwise indicated, terms "substantially", "approximately", and "in the order of" mean "to within 10%". Further, in the present description, term "connected" is used to designate a direct electric connection, with no intermediate electronic component, for example, by means of a conductive track, and term "coupled" or term "linked" will be used to designate either a direct electric connection (then meaning "connected") or a connection via one or a plurality of intermediate components (resistor, capacitor, etc.).

The present description relates to light-emitting devices comprising semiconductor elements having the shape of microwires, of nanowires, or of pyramids.

Term "microwire" or "nanowire" designates a three-dimensional structure having an elongated shape, for example, cylindrical, conical, or tapered, along a preferred direction, having at least two dimensions, called minor dimensions, in the range from 50 nm to 2.5 µm, preferably from 300 nm to 2.5 µm, the third dimension, called major dimension, being greater than or equal to 1 time, preferably greater than or equal to 5 times, and more preferably still greater than or equal to 10 times, the largest minor dimension. In certain embodiments, the minor dimensions may be smaller than or equal to approximately 1 µm, preferably in the range from 100 nm to 1 µm, more preferably from 300 nm to 800 nm. In certain embodiments, the height of each microwire or nanowire may be greater than or equal to 500 nm, preferably in the range from 1 µm to 50 µm.

In the following description, term "wire" is used to mean "microwire" or "nanowire". Preferably, the median line of the wire which runs through the centers of gravity of the cross-sections, in planes perpendicular to the preferred direction of the wire, is substantially rectilinear and is called "axis" of the wire hereafter. The base of the wire for example has an oval, circular, or polygonal shape, particularly triangular, rectangular, square, or hexagonal.

In the following description, term pyramid or truncated pyramid designates a three-dimensional structure having a pyramidal shape. The pyramidal structure may be truncated, that is, the top of the cone is absent and replaced with a flat area. The base of the pyramid is inscribed within a polygon having a side dimension from 100 nm to 10 µm, preferably from 1 to 3 µm. The polygon forming the base of the pyramid may be a hexagon. The height of the pyramid between the base of the pyramid and the apex or the top plateau varies from 100 nm to 20 µm, preferably from 1 µm to 10 µm.

In the following description, embodiments will be described in the case of a light-emitting device comprising light-emitting diodes.

FIG. 1 is a partial simplified cross-section view of a light-emitting device 10 formed from wires such as previously described and capable of emitting an electromagnetic radiation.

Device 10 comprises, from bottom to top in FIG. 1:
a first biasing electrode 12;
a doped substrate 14, for example, semiconductor, of a first conductivity type, for example, N-type doped, and comprising parallel surfaces 16 and 18, surface 16 being in contact with electrode 12;
doped or partially doped semiconductor regions 19 formed in substrate 14, of a second conductivity type opposite to the first conductivity type, for example, P-type doped, and extending in substrate 14 from surface 18 across part of the thickness of substrate 14;
semiconductor elements 20, which, in the present embodiment, correspond to wires, three wires 20 of parallel axis D being shown, each wire 20 comprising a lower portion 21 of the first conductivity type continued by an upper portion 22 of the first conductivity type, lower portion 21 resting on substrate 14 and being possibly in contact with substrate 14 or separated from substrate 14 by a seed portion not shown in FIG. 1;
an electrically-insulating layer 23 covering the periphery of the lower portion 21 of each wire 20 and covering surface 18 between wires 20;
a shell 25 covering the outer wall 24 of the upper portion 22 of each wire 20, shell 25 comprising at least one stack of an active layer 26 covering upper portion 22 and of a semiconductor layer 27 of the second conductivity type covering active layer 26;
a second electrode layer 28 covering each shell 25; and
a conductive layer 29, preferably at least partly reflective, for example, a metal layer, which may cover electrode layer 28 between wires 20 without however extending on wires 20.

Light-emitting device 10 further comprises a third electrode, not shown, in contact with semiconductor regions 19. The assembly formed by a wire 20 and shell 25 forms a light-emitting diode DEL. When a plurality of light-emitting diodes DEL are formed on substrate 14, they may be connected in series and/or in parallel and form an assembly of light-emitting diodes. The assembly may comprise from a few light-emitting diodes DEL to a few thousands of light-emitting diodes DEL.

The junction between each P-type doped region 19 and the N-type doped portion of substrate 14, extending around region 19, forms a photodiode PH.

Second electrode 28 is coupled to a node A1, first electrode 12 is coupled to a node A2, and the third electrode is coupled to a node A3. Since the third electrode is not shown in FIG. 1, each semiconductor region 19 is shown as coupled to node A3.

In operation, the voltage applied between electrodes 12 and 28 is such that each light-emitting diode DEL is conductive so that the active layer 26 of each light-emitting diode DEL emits a light radiation. For each light-emitting diode DEL, a portion of the radiation emitted by active layer 26 of light-emitting diode DEL is guided in wire 20 and escapes into substrate 14 through the base of wire 20. This radiation thus does not take part in the general light radiation emitted by light-emitting device 10 and which is perceived by an observer. FIG. 1 schematically shows examples of paths 30 of such light rays. The inventors have shown that the radiation coming out of the foot of each wire 20 can be at least partially captured by the photodiode PH which surrounds wire 20. Given that the ratio of the light power captured by each photodiode PH to the light power emitted by the neighboring light-emitting diodes DEL can be known, the signal supplied by each photodiode PH is thus representative of the light power emitted by the light-emitting diodes neighboring photodiode PH.

According to an embodiment, photodiodes PH are reverse-biased. The reverse current of each photodiode PH then depends on the light radiation captured by photodiode PH. In the embodiment shown in FIG. 1, this means that the potential at node A3 is smaller than the potential at node A2.

According to another embodiment, photodiodes PH are forward biased. Photodiodes PH can then be used as a temperature sensor.

Conductive layer 29 advantageously enables to avoid for the photodiodes PH to receive a light radiation through surface 18. Conductive layer 29 improves the homogeneity of the current distribution in electrode layer 28. As a variation, conductive layer 29 may be omitted.

Substrate 14 may correspond to a monoblock structure or correspond to a layer covering a support made of another material. Substrate 14 is preferably a semiconductor substrate, for example, a silicon, germanium, silicon carbide, or GaAs substrate. Preferably, substrate 14 is a single-crystal silicon substrate. Preferably, it is a semiconductor substrate compatible with manufacturing methods implemented in microelectronics. Substrate 14 may correspond to a multilayer structure of silicon-on-insulator type, also called SOI. The thickness of substrate 14 is for example in the range from 10 μm to 1.5 mm.

Substrate 14 is doped with the first conductivity type at least across part of its thickness from surface 18. When substrate 14 is monoblock, it may be uniformly doped. As a variation, substrate 14 may comprise a doped region of the first conductivity type extending from surface 18 into the thickness of substrate 14, only across part of the thickness of substrate 14, and resting on a less heavily-doped or non-doped region. Substrate 14 is for example a doped substrate of the first conductivity type with a dopant concentration in the range from $5*10^{16}$ atoms/cm$^3$ to $2*10^{20}$ atoms/cm$^3$, preferably in the range from $5*10^{17}$ atoms/cm$^3$ to $5*10^{19}$ atoms/cm$^3$, for example, approximately $3*10^{18}$ atoms/cm$^3$. In the case of a silicon substrate 14, examples of P-type dopants are boron (B) or indium (In) and examples of N-type dopants are phosphorus (P), arsenic (As), or antimony (Sb). Surface 18 of silicon substrate 10 may be a (100) surface or a (111) surface.

Each semiconductor region 19 may have a depth, measured from surface 18, in the range from 200 nm to 4 μm, preferably in the range from 400 nm to 800 nm. Each region 19 is for example doped with the second conductivity type with a dopant concentration in the range from $5*10^{16}$ atoms/cm$^3$ to $1*10^{22}$ atoms/cm$^3$, preferably in the range from $5*10^{17}$ atoms/cm$^3$ to $5*10^{19}$ atoms/cm$^3$, for example, approximately $6*10^{18}$ atoms/cm$^3$. Semiconductor regions 19 do not extend under wires 20 so that a doped portion 32 of the first conductivity type extends all the way to surface 18 for each wire 20.

According to an embodiment, each semiconductor region 19 may be formed by ion implantation of dopants. According to another embodiment, semiconductor region 19 may be formed by epitaxy. According to an embodiment, each semiconductor region 19 is formed by at least one implantation step, which may be implemented before the forming of wires 20 and of shells 25 or after the forming of wires 20 and of shells 25. Preferably, semiconductor regions 19 are formed by at least one implantation step implemented after the forming of wires 20 and of shells 25. This enables to avoid a diffusion of the dopants from semiconductor region 19 during the steps of forming light-emitting diodes DEL. When semiconductor regions 19 are formed by at least one implantation step implemented after the forming of wires 20 and of shells 25, wires 20 and shells 25 may be covered with a dielectric protection layer.

According to another embodiment, each semiconductor region 19 may be divided into a plurality of non-doped or doped semiconductor sub-regions of the second conductivity type, with a dopant concentration which increases with the distance from doped substrate 14 of the first conductivity type. In this case, semiconductor regions 19 may be formed by a plurality of implantation steps.

First electrode 12 may correspond to a conductive layer which extends on surface 16 of substrate 14. The material forming electrode 12 is, for example, nickel silicide (NiSi), aluminum (Al), aluminum silicide (AlSi), titanium (Ti), copper (Cu), tungsten silicide (WSi$_2$), or titanium silicide (TiSi). As a variation, electrode 12 may be formed on the side of surface 18 around the substrate area 14 where wires 20 are formed. The third electrode, not shown, may have the same composition as first electrode 12.

Insulating layer 23 may be made of a dielectric material, for example, of silicon oxide (SiO$_2$), of silicon nitride (Si$_x$N$_y$, where x is approximately equal to 3 and y is approximately equal to 4, for example, Si$_3$N$_4$), of silicon oxynitride (particularly of general formula SiO$_x$N$_y$, for example, Si$_2$ON$_2$), of hafnium oxide (HfO$_2$), or of diamond. As an example, the thickness of insulating layer 23 is in the range from 5 nm to 300 nm, for example, equal to approximately 100 nm. Insulating layer 23 may have a monolayer structure or may correspond to a stack of two layers or of more than two layers.

Semiconductor elements 20 are at least partly made of at least one semiconductor material. The semiconductor material is selected from the group comprising III-V compounds or II-VI compounds.

Semiconductor elements 20 may be at least partly made of semiconductor materials mainly comprising a III-V compound, for example, a III-N compound. Examples of group-III elements comprise gallium (Ga), indium (In), or aluminum (Al). Examples of III-N compounds are GaN, AN, InN, InGaN, AlGaN, or AlInGaN. Other group-V elements may also be used, for example, phosphorus or arsenic. Generally, the elements in the III-V compound may be combined with different molar fractions.

Semiconductor elements 20 may be at least partly made from semiconductor materials mainly comprising a II-VI compound. Examples of group-II elements comprise group-IIA elements, particularly beryllium (Be) and magnesium (Mg), and group-IIB elements, particularly zinc (Zn), cadmium (Cd), and mercury (Hg). Examples of group-VI elements comprise group-VIA elements, particularly oxygen (O) and tellurium (Te). Examples of II-VI compounds are ZnO, ZnMgO, CdZnO, CdZnMgO, CdHgTe, CdTe, or HgTe. Generally, the elements in the II-VI compound may be combined with different molar fractions.

Semiconductor elements 20 may comprise a dopant. As an example, for III-V compounds, the dopant may be selected from the group comprising a P-type group-II dopant, for example, magnesium (Mg), zinc (Zn), cadmium (Cd), or mercury (Hg), a P-type group-IV dopant, for example, carbon (C), or an N-type group-IV dopant, for example, silicon (Si), germanium (Ge), selenium (Se), sulfur (S), terbium (Tb), or tin (Sn).

When the three-dimensional semiconductor elements 20 of the optoelectronic device correspond to wires, the total height of each wire may be in the range from 250 nm to 50 µm. Each wire 20 may have a semiconductor structure elongated along an axis substantially perpendicular to surface 18. Each wire 20 may have a generally cylindrical shape with an oval, circular, or polygonal base, particularly triangular, rectangular, square, or hexagonal. The axes of two adjacent wires 20 may be distant by from 0.5 µm to 10 µm and preferably from 1.5 µm to 5 µm. As an example, wires 20 may be regularly distributed, particularly in a hexagonal network.

According to an embodiment, the lower portion 21 of each wire is predominantly made of a III-N compound, for example, gallium nitride, doped with a first conductivity type, for example, N-type doped. The N-type dopant may be silicon. The height of lower portion 21 may be in the range from 200 nm to 25 µm.

According to an embodiment, upper portion 22 of each wire is for example at least partly made of a III-N compound, for example, gallium nitride. Portion 22 may be doped with the first conductivity type, for example, type N, or not be intentionally doped. The height of portion 22 may be in the range from 500 nm to 25 µm.

As a variation, for each wire 20, insulating layer 23 may extend over part of upper portion 22, not extend over the entire portion 21, or extend over a portion of shell 25. As a variation, shell 25 may extend over all or part of lower portion 21.

When the three-dimensional semiconductor elements 20 of optoelectronic device 10 correspond to pyramids, the height of each pyramid may be in the range from 100 nm to 25 µm. Each pyramid may have a semiconductor structure elongated along an axis substantially perpendicular to surface 18. The base of each pyramid may have a general shape of oval, circular, or polygonal type, particularly triangular, rectangular, square, or hexagonal. The centers of two adjacent pyramids may be distant by from 0.25 µm to 10 µm and preferably from 1.5 µm to 5 µm. As an example, the pyramids may be regularly distributed, particularly in a hexagonal network.

In the case of a wire 20 predominantly made of GaN, the crystal structure of the wire may be of wurtzite type, the wire extending along crystallographic direction C.

Active layer 26 is the layer from which most of the radiation provided by device 10 is emitted. Active layer 26 may comprise confinement means. As an example, layer 26 may comprise a single quantum well. It then comprises a semiconductor material different from the semiconductor material forming upper portion 22 and layer 27 and having a bandgap smaller than that of the material forming upper portion 22 and layer 27. Active layer 26 may comprise multiple quantum wells. It then comprises a stack of semiconductor layers forming an alternation of quantum wells and of barrier layers.

Semiconductor layer 27 may comprise a stack of a plurality of layers especially comprising:
   an intermediate layer having a conductivity type opposite to that of upper portion 22 and covering active layer 26; and
   a bonding layer covering the intermediate layer and covered with electrode 28.

The intermediate layer, for example, P-type doped, may correspond to a semiconductor layer or to a stack of semiconductor layers and enables to form a P-N or P-I-N junction, active layer 26 being located between the intermediate P-type layer and N-type portion 22 of wire 20 of the P-N or P-I-N junction.

The bonding layer may correspond to a semiconductor layer or to a stack of semiconductor layers and enables to form an ohmic contact between the intermediate layer and electrode 28. As an example, the bonding layer may be very heavily doped, with a doping type opposite to that of lower portion 36, until degeneration of the semiconductor layer(s), for example, P-type doped at a concentration greater than or equal to $10^{20}$ atoms/cm$^3$.

The stack of semiconductor layers may comprise an electron barrier layer formed of a ternary alloy, for example, of aluminum gallium nitride (AlGaN) or of aluminum indium nitride (AlInN) in contact with the active layer and the intermediate layer, to ensure a good confinement of electric carriers in the active layer.

Second electrode 28 is capable of biasing active layer 26 covering each wire 20 and of giving way to the electromagnetic radiation emitted by light-emitting diodes DEL. The material forming electrode 28 may be a transparent and conductive material such as indium tin oxide (ITO), zinc oxide, doped or not with aluminum or gallium, or graphene. As an example, electrode layer 28 has a thickness in the range from 5 nm to 200 nm, preferably from 20 nm to 50 nm.

An example of a method of manufacturing light-emitting diodes DEL is described in patent application US2014/0077151.

According to an embodiment, each semiconductor element 20 is not in direct contact with substrate 14 but directly rests on a portion of a material favoring the growth of semiconductor elements 20, called seed pads. As an example, the material forming the seed pads may be a nitride, a carbide, or a boride of a transition metal from column IV, V, or VI of the periodic table of elements, or a combination of these compounds. As an example, the seed pads may be made of aluminum nitride (AlN), of aluminum oxide (Al$_2$O$_3$), of boron (B), of boron nitride (BN), of titanium (Ti), of titanium nitride (TiN), of tantalum (Ta), of tantalum nitride (TaN), of hafnium (Hf), of hafnium nitride (HfN), of niobium (Nb), of niobium nitride (NbN), of zirconium (Zr), of zirconium borate (ZrB$_2$), of zirconium nitride (ZrN), of silicon carbide (SiC), of tantalum carbo-nitride (TaCN), of magnesium nitride in Mg$_x$N$_y$ form, where x is approximately equal to 3 and y is approximately equal to 2, for example, magnesium nitride according to form Mg$_3$N$_2$. The seed pads may be doped with the same conductivity type as substrate 14. The seed pads for example have a thickness in the range from 1 nm to 100 nm, preferably in the range from 10 nm to 30 nm.

When the seed pads are made of aluminum nitride, they may be substantially textured and have a preferred biasing. The texturing of the seed pads may be obtained by an additional treatment performed after the deposition of the seed layer. It for example is an anneal under an ammonia flow (NH$_3$). In the case of a wire 20 predominantly made of GaN, each seed pad may favor the growth of GaN with the N polarity.

Figure 2:
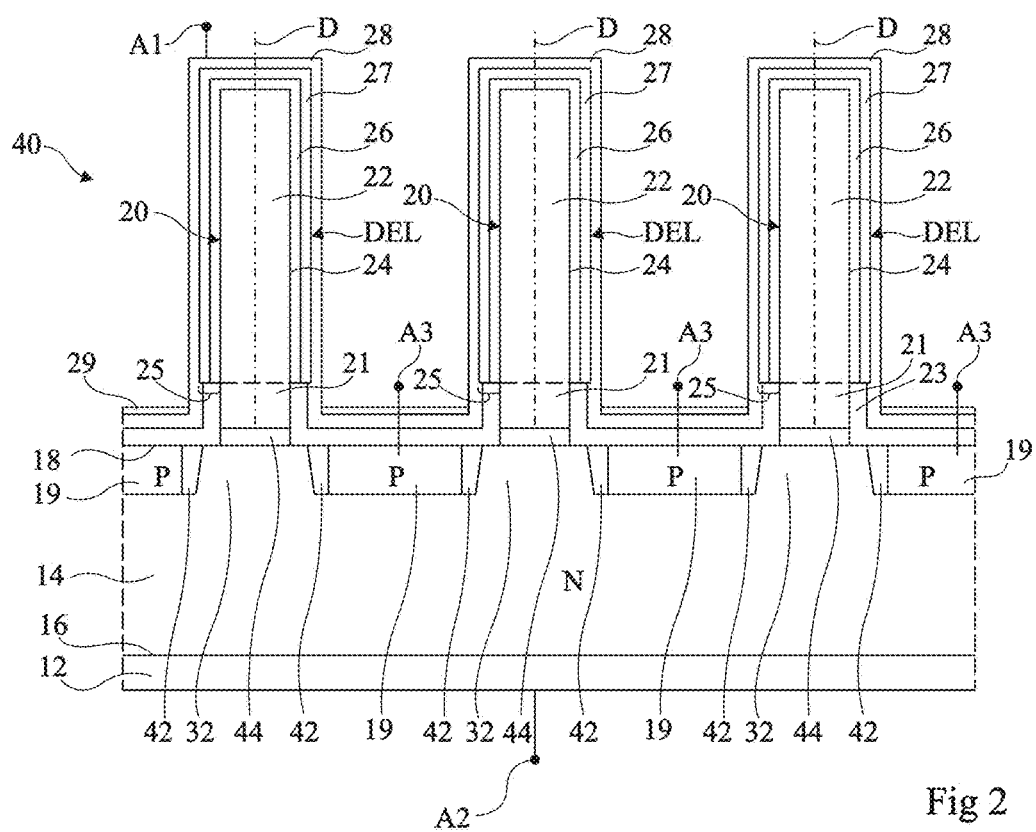

FIG. 2 shows another embodiment of a light-emitting device 40. Light-emitting device 40 comprises all the elements of light-emitting device 10 shown in FIG. 1 and further comprises electrically-insulating regions 42 extending in substrate 14 from surface 18 and laterally surrounding semiconductor regions 19. Insulating regions 42 are for example made of silicon oxide. Each insulating region 42 preferably has a depth greater than or equal to the depth of the semiconductor region 19 that it surrounds. Insulating regions 42 enable to decrease leakage currents in each photodiode PH due to the biasing of light-emitting diodes DEL. Further, insulating regions 42 enable to decrease the diffusion of the dopants from semiconductor regions 19 towards portion 32. Insulating regions 42 are for example obtained by a shallow trench insulation structure or STI structure forming method.

In FIG. 2, seed pads 44 have further been shown under each wire 20.

Figure 3:
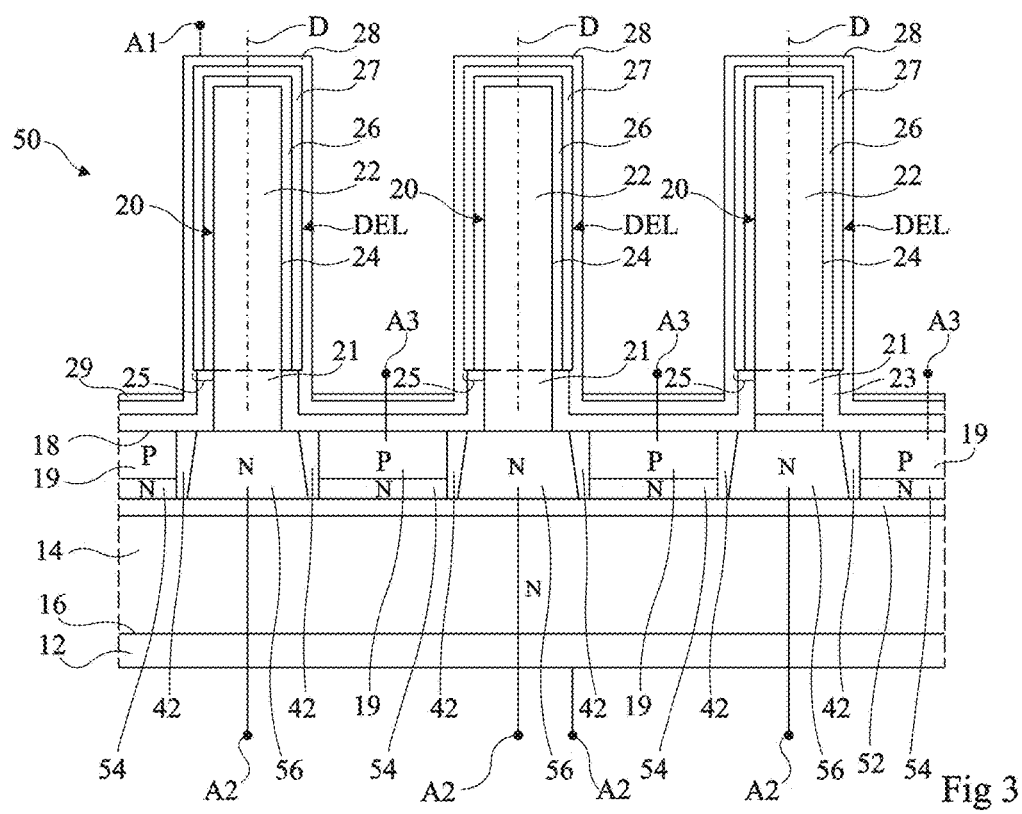

FIG. 3 shows another embodiment of a light-emitting device 50. Light-emitting device 50 comprises all the elements of the light-emitting device 40 shown in FIG. 2 and further comprises an electrically-insulating layer 52 located in depth in substrate 14 and delimiting with insulating regions 42, for each semiconductor region 19, a doped region 54 of substrate 14 of the first conductivity type and electrically insulated from the rest of substrate 14. Each region 54 of the first conductivity type is interposed between one of semiconductor regions 19 and insulating layer 52. Each region 54 of the first conductivity type is further preferably surrounded with insulating region 42, which surrounds semiconductor region 19. Insulating layer 52 is for example made of silicon oxide. Each photodiode is formed by the junction between semiconductor region 19 and the underlying region 54. Each region 54 is coupled to a node A4 (not shown). Insulating layer 52 further delimits doped regions 56 of substrate 14 of the first conductivity type supporting wires 20. Each region 56 is coupled to node A2. Node A4 may be electrically coupled to node A2. In this case, node A4 and node A2 are at the same electric potential. Substrate 14 for example corresponds to an SOI structure. Light-emitting device 50 has parasitic currents at the level of the photodiodes which are decreased with respect to those of light-emitting device 40.

FIGS. 4A to 4F show partial simplified top views of surface 18 of light-emitting device 10 and of conductive pads 57 corresponding to the third previously-described electrode A3. In FIGS. 4A to 4F, area 58 of surface 18 of substrate 14 having wires 20, not shown, located thereon, has been delimited by a dotted line.

Figure 4A:
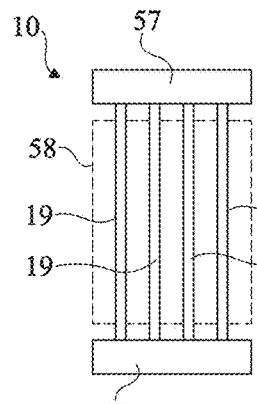
FIGS. 4A to 4F are partial simplified top views of embodiments of light-emitting devices illustrating a plurality of distributions of regions of the light-emitting device.
Figure 4B:
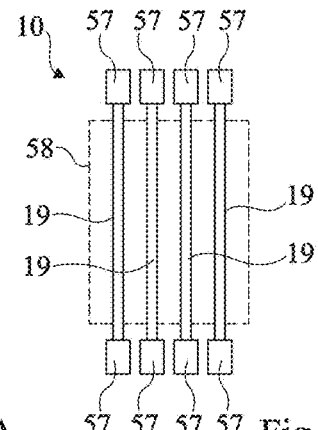
Figure 4C:
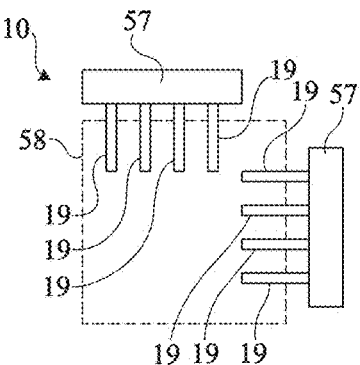
Figure 4D:
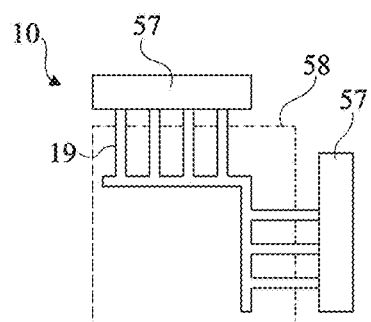
Figure 4E:
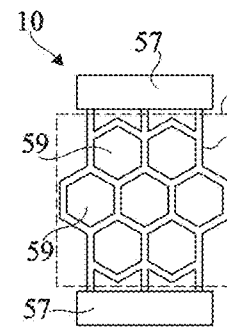
Figure 4F:
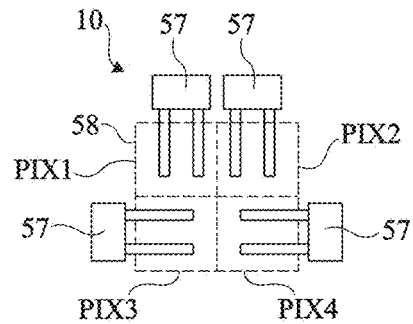
Figure 5:
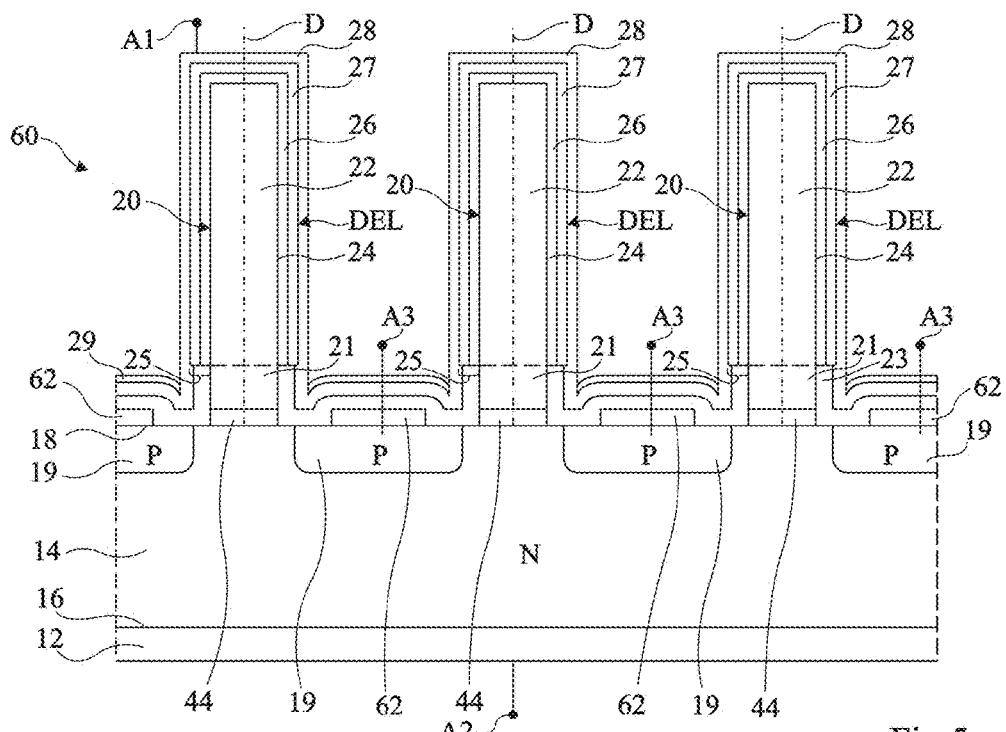
FIG. 5 is a partial simplified cross-section view of another embodiment of a light-emitting device comprising microwires or nanowires.
Figure 6:
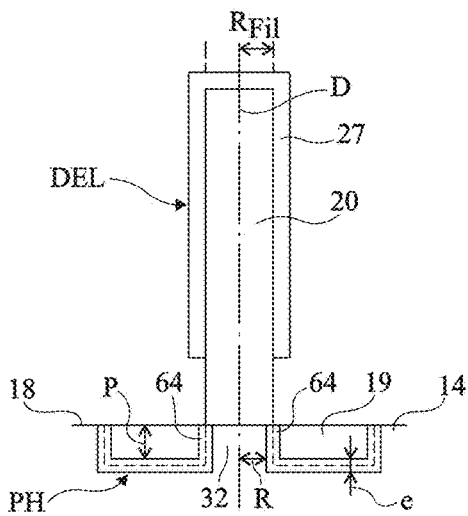
FIG. 6 is a partial simplified cross-section view of a structure used to perform simulations.
Figure 7:
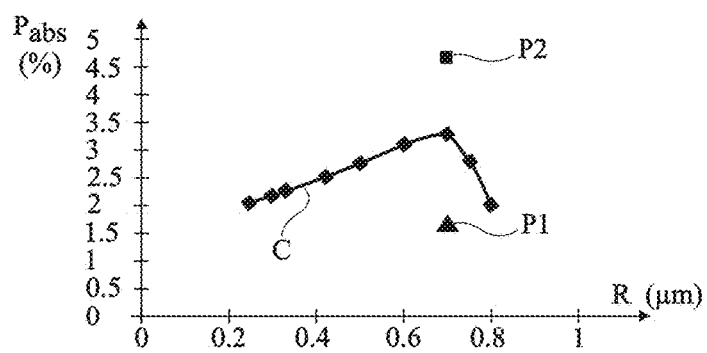
FIG. 7 is a curve of the variation of the power absorbed by the light sensor according to the radius of the light sensor.

As shown in the drawings, conductive pads 57 are preferably located outside of area 58 of surface 18 of substrate 14 having the light-emitting diodes located thereon. Semiconductor regions 19 may have any shape, for example, the shape of parallel rectilinear strips thoroughly crossing area 58, as shown in FIGS. 4A and 4B, of parallel rectilinear strips only partially crossing area 58, as shown in FIGS. 4C and 4F, or of rectilinear strips which cross one another as shown in FIG. 4E and which delimit hexagonal openings 59, each hexagonal opening 59 being located at the level of a semiconductor element 20. Semiconductor regions 19 may be separate, as shown in FIGS. 4A, 4B, 4C, and 4F or be coupled to one another, as shown in FIGS. 4D and 4E. Each conductive pad 57 may be connected to all the semiconductor regions 19, as shown in FIG. 4A, 4D, or 4E, or only to some of them, as shown in FIGS. 4B, 4C, and 4F. As shown in FIG. 4F, area 58 may be divided into a plurality of sub-regions PIX1, PIX2, PIX3, and PIX4, each conductive pad 57 being connected to the semiconductor regions 19 associated only with one of sub-regions PIX1, PIX2, PIX3, and PIX4. Such a configuration particularly enables to separately process the signals supplied by the photodiodes associated with each sub-region PIX1, PIX2, PIX3, and PIX4. The portions of substrate 14 associated with each pixel PIX1, PIX2, PIX3, and PIX4 may be electrically insulated from one another so that the light-emitting diodes of one of the pixels PIX1, PIX2, PIX3, and PIX4 can be controlled independently from the light-emitting diodes of another pixel PIX1, PIX2, PIX3, and PIX4. In FIGS. 4A to 4F, semiconductor regions 19 are shown in the form of strips. As a variation, semiconductor regions 19 may correspond, in top view, to a plane extending over all or part of area 58 and crossed by openings, each opening being located at the level of a semiconductor element 20. FIG. 5 shows another embodiment of a light-emitting device 60. Light-emitting device 60 comprises all the elements of light-emitting device 10 shown in FIG. 1 and further comprises conductive tracks 62, for example, metallic, covering semiconductor regions 19 and in contact with semiconductor regions 19. Conductive tracks 62 are coupled to conductive pads 57, not shown in FIG. 5. Conductive tracks 62 improve the current conduction from semiconductor regions 19 to conductive pads 57. In the case where seed pads 44 made of a conductive material are present, conductive tracks 62 may be made of the same material as seed pads 44 and be formed simultaneously to seed pads 44. FIG. 6 partially and schematically shows a simplified structure of the light-emitting diode DEL which has been used to determine by simulation the variation of the light power absorbed by photodiode PH when the dimensions of photodiode PH vary. Light-emitting diode DEL is represented by wire 20 and semiconductor layer 27. The emission of light is performed at the interface between wire 20 and layer 27. For the simulations, photodiode PH has been represented by a depletion area 64, also called space charge area, which forms in operation at the junction between semiconductor region 19 having a P-type conductivity and the rest of the N-type substrate 14. For the simulations, semiconductor region 19 surrounds N-type portion 32 of substrate 14 under wire 20, which extends all the way to wire 20. Call e the thickness of depletion area 64, P the depth of semiconductor region 19, and R the mean radius, between axis D and the inner lateral edge of depletion area 64, that is, the mean radius of portion 32. Portion 32 may have a cross-section, perpendicular to axis D, in the shape of a circle. In this case, radius R corresponds to the radius of portion 32. Portion 32 may have a cross-section having the shape of a polygon. In this case, mean radius R corresponds to the average of the distance between axis D and the lateral edge of portion 32. FIG. 7 shows two points P1 and P2 and a curve C, obtained by simulation from the structure of FIG. 6, of the variation of the light power $P_{abs}$ absorbed by photodiode PH according to radius R. For the simulations, the mean radius of wire 20 was 0.7 μm and depth P was 500 nm. Point P1 has been obtained for a thickness e of depletion area 64 equal to 100 nm. Point P2 has been obtained for a thickness e of depletion area 64 equal to 300 nm. Curve C has been obtained for a thickness e of depletion area 64 equal to 200 nm. The absorbed light power $P_{abs}$ is maximum when mean radius R is substantially equal to the mean radius of wire 20. Further, the absorbed light power $P_{abs}$ increases as thickness e of depletion area 64 increases. However, a compromise should be found between thickness e of depletion area 64 and the dimensions of semiconductor region 19, which should be sufficient to obtain a proper conduction of the current detected by photodiode PH.

For a current injected into light-emitting diode DEL of approximately 10 µA and an external quantum efficiency of active layer 26 of approximately 80%, the maximum absorbed power $P_{abs}$ is in the range from 2% to 3% and the current supplied by the photodiode is approximately 0.2 µA. The intensity of this current is compatible with devices conventionally used for the processing of signals supplied by sensors.

Specific embodiments have been described. Various alterations and modifications will occur to those skilled in the art. In particular, although in the previously described embodiments, semiconductor regions 19 are P-type doped and substrate 14 and wires 20 are, at least partly, N-type doped, it should be clear that the conductivity types may be inverted.

The invention claimed is:

1. A light-emitting device comprising:
   an at least partially doped substrate of a first conductivity type, comprising a surface;
   light-emitting diodes, each comprising at least one non-doped or doped three-dimensional semiconductor element of the first conductivity type, resting on said surface, in contact with said surface or separated from said surface by a pad, wherein the semiconductor elements are nanowires, microwires, and/or nanometer- or micrometer-range pyramidal structures; and
   semiconductor regions forming at least partially doped photodiodes of a second conductivity type opposite to the first conductivity type, extending in the substrate from said surface between at least some of the three-dimensional semiconductor elements, for each three-dimensional semiconductor element, a portion of the substrate of the first conductivity type extending all the way to said surface in contact with each three-dimensional semiconductor element or with the pad on which the three-dimensional semiconductor element rests;
   an at least partially reflective layer covering the semiconductor regions between the three-dimensional semiconductor elements in order to prevent the semiconductor regions from receiving light radiation through said surface;
   an insulating layer interposed between the semiconductor regions and said at least partially reflective layer; and
   electrically-insulating regions extending along the lateral edges of at least some semiconductor regions.

2. The light-emitting device of claim 1, wherein each three-dimensional semiconductor element is mainly made of a compound selected from the group comprising III-V compounds and II-VI compounds.

3. The light-emitting device of claim 1, wherein the substrate is at least partly made of a semiconductor material selected from the group comprising silicon, germanium, silicon carbide, or GaAs.

4. The light-emitting device of claim 1, further comprising conductive tracks on said surface in contact with the semiconductor regions.

5. The light-emitting device of claim 1, further comprising an electrically-insulating layer located in depth in the substrate and comprising, for each semiconductor region, a region of the first conductivity type interposed between the insulating layer and the semiconductor region.

6. The light-emitting device of claim 1, wherein the semiconductor regions have the shape of strips, electrically connected or not.

7. The light-emitting device of claim 1, wherein the semiconductor regions have the shape of a hexagonal tiling.

8. The light-emitting device of claim 1, wherein the semiconductor regions form a continuous region crossed by said portions.

9. The light-emitting device of claim 1, wherein the semiconductor regions are formed by ion implantation of dopants.

10. The light-emitting device of claim 1, wherein the semiconductor regions are formed by epitaxy.

11. The light-emitting device of claim 1, wherein the light-emitting diodes are distributed into at least first and second separately controlled assemblies of light-emitting diodes.

12. The light-emitting device of claim 11, wherein the semiconductor regions are distributed into at least first and second groups of semiconductor regions, the semiconductor regions of the first group of semiconductor regions extending in the substrate from said surface between at least some of the three-dimensional semiconductor elements of the first assembly of light-emitting diodes and the semiconductor regions of the second group of semiconductor regions extending in the substrate from said surface between at least some of the three-dimensional semiconductor elements of the second assembly of light-emitting diodes, the semiconductor regions of the first group of semiconductor regions being electrically insulated from the semiconductor regions of the second group of semiconductor regions.

* * * * *